United States Patent [19]

Lawrence et al.

[11] 4,034,197
[45] July 5, 1977

[54] DIGITAL FILTER CIRCUIT

[75] Inventors: Victor Bernard Lawrence, Matawan; Kent Vincent Mina, Colts Neck, both of N.J.

[73] Assignee: Bell Telephone Laboratories, Incorporated, Murray Hill, N.J.

[22] Filed: June 30, 1976

[21] Appl. No.: 701,195

[52] U.S. Cl. ............................. 235/156; 235/152
[51] Int. Cl.² ..................... G06F 15/34; G06F 7/52
[58] Field of Search ........................... 235/152, 156

[56] References Cited

UNITED STATES PATENTS

| 3,749,895 | 7/1973 | Kao ........................... 235/152 |
| 3,906,199 | 9/1975 | Kieburtz et al. ............. 235/152 |

OTHER PUBLICATIONS

H. Butterwick, "Suppression of Parasitic Oscillations . . . Rounding Arithmetic", special reprint from AEV, band 29, 1975, pp. 371–374.

M. Buttner, "Some Experimental Results . . . In Recursive Digital Filters", NTZ–Aufsatze NTZ 28, (1975), H. 11, pp. 402–406.

*Primary Examiner*—Jerry Smith
*Attorney, Agent, or Firm*—Barry H. Freedman

[57] ABSTRACT

In U.S. Pat. No. 3,906,199, issued to R. B. Kieburtz and K. V. Mina on Sept. 16, 1975, limit cycle noise is reduced in a second order recursive digital filter by a circuit which randomly inhibits the rounding signal in one of the digital multipliers disposed in the filter. It has been found, however, that in certain instances, this approach results in even longer transients.

In accordance with the present invention, random inhibiting is constrained to instances in which limit cycle noise is reduced, by monitoring, with suitable logic circuitry, the signals present in the various feedback loops of the filter. Generally, it has been found that the inhibiting circuit should be allowed to operate only if $D_1$ and $D_2$ satisfy predetermined magnitude and polarity relationships, where $D_1$ = a version of the filter output signal $Y(n)$ that is removed in time by one sample interval, and $D_2$ = a version of the filter output signal $Y(n)$ that is removed in time by two sample intervals.

In accordance with another aspect of the invention, DC and half sampling rate limit cycles are eliminated by monitoring three consecutive values of $D_1$ or, alternatively, the present values of $Y(n)$, $D_1$ and $D_2$. If the same magnitudes are detected, the magnitude of the next $D_1$ is reduced by one.

29 Claims, 16 Drawing Figures

PINWHEEL LIMIT CYCLE
$D_1-D_2$ PLOT OF A 2ND ORDER FILTER WITH
$B_2=.9375$  $B_1=-0.0625$
AND INITIAL CONDITIONS $D_1=D_2=8$

FIG. 10

FIG. 13
CUMULATIVE DISTRIBUTION CURVE
$B_2 = .9375 \quad B_1 = -1.84375$

FIG. 14
CUMULATIVE DISTRIBUTION CURVE
"ROLLING PIN" LIMIT CYCLE
$B_2 = .9375 \quad B_1 = -1.875 \quad P = .2$

DIGITAL FILTER CIRCUIT

BACKGROUND OF THE INVENTION

1. Field of the Invention

This invention relates generally to digital filters and, more particularly, to second order recursive digital filters including circuitry for eliminating limit cycles.

2. Description of the Prior Art

When a recursive digital filter is implemented using fixed point arithmetic, errors occur due to quantization of the products. With a constant input to a feedback section of the filter, these errors can lead to small periodic oscillations called limit cycles, at the output of the filter. The amplitude of these limit cycles (which are to be distinguished from the large limit cycles associated with an overflow condition) is a determining factor in the idle channel behavior of the filter, and accordingly affect the internal word length requirements and ultimately the cost of the filter.

Limit cycles have been discussed extensively by many authors. See, for example, "A Bound on Limit Cycles in Fixed-Point Implementations of Digital Filters", I. W. Sandberg and J. F. Kaiser, *IEEE Trans. Audio and Electroacoustics*, Vol. AU-20, No. 2, June, 1972; "An Absolute Bound on Limit Cycles Due to Roundoff Errors in Digital Filters", J. L. Long and T. N. Trick, *IEEE Trans. Audio and Electroacoustics*, Vol. AU-21, No. 1, February, 1973; and "Some Remarks on the Classification of Limit Cycles in Digital Filters", T. A. C. M. Classen et al. *Phillips Research Reports*, 28, pp 297–305, 1973. Still other pertinent references are cited in U.S. Pat. No. 3,906,199 isued to R. B. Kieburtz and K. V. Mina on Sept. 16, 1975.

While most authors have tried to estimate or bound the peak amplitude, rms value, or the fundamental frequency of limit cycles, the approach by Kieburtz et al disclosed in the aforesaid patent is significantly different. In that patent, limit cycle noise in a second order recursive digital filter is reduced by a circuit which randomly inhibits the rounding signal in one of the digital multipliers disposed in the filter. While the Kieburtz et al., technique has indeed been found advantageous in many instances, it has nevertheless been found that for certain signal values and filter constraints, even longer transients or limit cycles may result. Additionally, the patentees' filter design is not equipped to eliminate half sampling rate or dc limit cycles which exhibit special properties that make suppression more difficult.

Based upon the foregoing, it is the broad object of the present invention to improve the performance and reduce the cost of digital filters by eliminating limit cycle noise. Specific objects are the reduction of limit cycles including dc or half-sample rate limit cycles, for the case of zero input to the filter.

SUMMARY OF THE INVENTION

The foregoing and additional objects are achieved in accordance with the invention by logic circuitry which constrains or controls the quantization of multiplier outputs such that random truncation of these outputs, rather than rounding, is allowed only in those cases in which such truncation is advantageous. In general, it has been found that the multiplier output should be truncated (i.e., rounding should be inhibited) only if certain predetermined relationships exist between the magnitude and polarity of the state variables $D_1$ and $D_2$ of a second order recursive filter, where $D_1$ = a version of the filter output signal $Y(n)$ that is removed in time by one sample interval, and $D_2$ = a version of the filter output $Y(n)$ that is removed in time by two sample intervals. In one specific form of a recursive filter, truncation is allowed to occur, in the case where $B_1$ (the multiplier coefficient in the first order feedback section) is negative and $B_2$ (the multiplier coefficient in the second order feedback section) is positive, only if:

$$\text{Sign } D_1 \neq \text{Sign } D_2$$

or $$\text{Magnitude } D_2 > \text{Magnitude } D_1.$$

Similarly, for the same form of filter and for the case where both $B_1$ and $B_2$ are positive, truncation is allowed only if:

$$\text{Sign } D_1 = \text{Sign } D_2$$

or $$\text{Magnitude } D_2 > \text{Magnitude } D_1.$$

In accordance with another aspect of the invention, dc and half sampling rate limit cycles are eliminated by (1) detecting the occurrence of three equal consecutive magnitudes of $D_1$ which is the same as detecting simultaneous equal magnitudes of $D_1$, $D_2$ and $Y(n)$, and (2) reducing the magnitude of the next $D_1$ by one, upon such detection.

BRIEF DESCRIPTION OF THE DRAWING

The above and other features and aspects of the present invention will be more readily appreciated by consideration of the following detailed description, when read in light of the accompanying drawing in which.

DETAILED DESCRIPTION

Figure 1A:
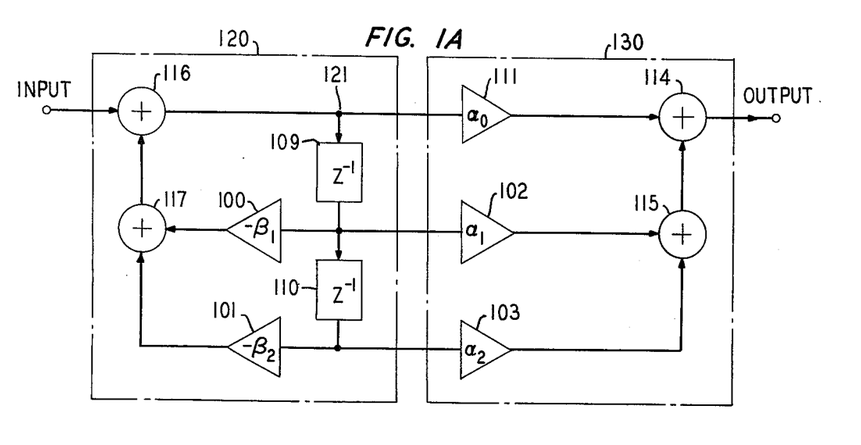
FIG. 1a is a block diagram of one form of a typical prior art second order digital filter section.

The second order filter arrangement illustrated in FIG. 1a is one form that is well known in the art. See, for example, "An Approach to the Implementation of Digital Filters", by L. B. Jackson et al., *IEEE Transactions on Audio and Electroacoustics*, VOL AU-16, September, 1968, pages 413–421. This form of filter can be thought of as containing two portions: A recursive portions 120 which determines the poles (gain) of the filter, and a nonrecursive portion 130, which determines the zeroes (attenuation) of the filter.

The recursive portion 120, to which the present invention is directed, includes a first feedback loop which includes a first digital multiplier 100 coupled to the output of a first delay circuit 109, and a second feedback loop which includes a second digital multiplier 101 coupled to the output of a second delay circuit 110. Delay circuit 109 (having a transfer function $Z^{-1}$) receives its input from the output point 121 of the recursive portion 120, and produces at its output a version $D_1$ of the recursive portion output $Y(n)$ which is delayed in time by one sample interval. Delay circuit 110 (also having a transfer function $Z^{-1}$) receives its input from the output of circuit 109, and produces at its output a version $D_2$ of the recursive portion output $Y(n)$ which is delayed in time by two sample intervals. The output of multiplier 101 (which is the product of $D_2(n)$ and the multiplier coefficient $-B_2$) is combined with the output of multiplier 100 (which is the product of $D_1(n)$ and the multiplier coefficient $-B_1$) in an adder 117. The output of adder 117 is combined with the input to the filter (denominated $X(n)$) by a second adder circuit 116 to yield the output of the recursive portion $(Y(n))$ at point 121.

The non-recursive portion 130 of the filter of FIG. 1a includes multipliers 111, 102 and 103 which receive inputs from adder 116 and delay circuits 109 and 110, respectively. The outputs of multipliers 102 and 103 are combined in an adder circuit 115, the output of which is coupled to one input of an adder 114. The second input to adder 114 is supplied from the output of multiplier 111, and the output of adder 114 constitutes the output of the entire filter. As stated previously, the configuration of non-recursive portion 130 is not directly pertinent to the present invention, and is described only for the sake of completeness.

With respect to recursive portion 120, inspection of FIG. 1a indicates that the output $Y(n)$ at point 121 is given by:

$$Y(n) = -B_1 \cdot D_1(n) - B_2 \cdot D_2(n) + X(n) \text{ for every } n \quad (1)$$

where $D_1(n) \equiv Y(n-1);$
$D_2(n) \equiv Y(n-2) \equiv D_1(n-1);$ and
$X(n) \equiv$ the sampled input to the filter.

For convenience, $X(n)$, $Y(n)$, $D_1(n)$ and $D_2(n)$ will hereafter be referred to simply as $X$, $Y$, $D_1$ and $D_2$, respectively.

The second order recursive portion 120 of the filter of FIG. 1a has a transfer function given by:

$$H(Z) = 1/[1 + B_1 Z^{-1} + B_2 Z^{-2}] \quad (2)$$

Figure 2:
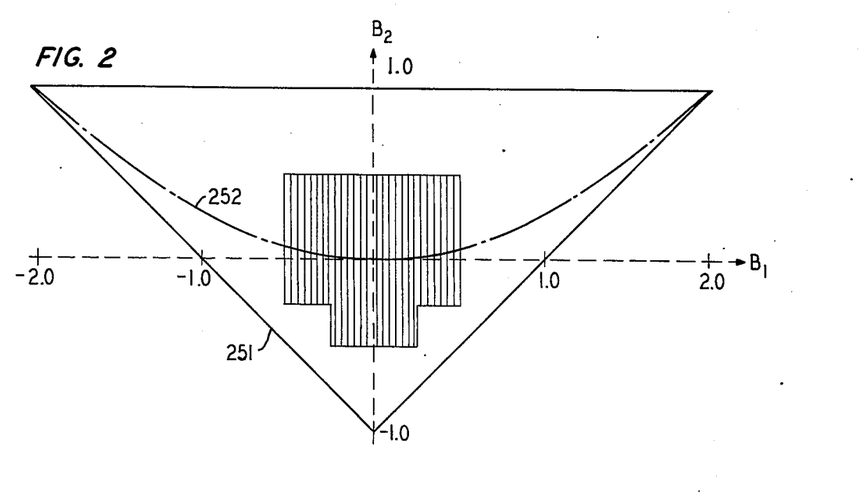
FIG. 2 is a graph showing the region of stable operation of the filters of FIGS. 1a and 1b.

The region of stable operation of the filter is inside the triangle 251 in the $B_2$-$B_1$ plane shown in FIG. 2. The parabolic curve 252 defined by $B_1^2 = 4B_2$ divides the triangle into two regions: Those with complex-Z-plane pole pairs (above the parabola) and those with real pole pairs (below the parabola). If the multipliers 100 and 101 of FIG. 1a are sign magnitude multipliers which each incorporate quantizing circuits for rounding the products formed thereby (for example, the prior art multiplier shown in FIG. 2 of the aforementioned Kieburtz et al., U.S. Pat. No. 3,906,199), then, for the case of zero input to the filter and non-zero initial conditions for the state variables $D_1$ and $D_2$, limit cycles can occur for large areas of the $B_2$-$B_1$ plane. These limit cycles, which are eliminated in accordance with the present invention, will be discussed further below.

Before proceeding further, it would do well to clarify the relationship between truncation and rounding, both generally and in relation to the specific multiplier of FIG. 2 of the Kieburtz et al., patent. In general, a number N in any base may be represented by:

$$N = \ldots N_c N_b N_a \cdot N_x N_y N_z \ldots \quad (3)$$

where $N_{a,b,c} \ldots$ and $N_{x,y,z} \ldots$ are individual digits. The decimal point between $N_a$ and $N_x$ separates the number into a "retained portion" on the left of the decimal and a "discarded portion" on the right of the decimal. The placement of the decimal point is based upon the number of digits desired in the final product. Thus, the terms "truncation of a product", and "rounding of a product", as used herein, both refer to the discarding of an unwanted portion of a product, which unwanted portion universally contains information (digits) which are less significant than the retained information (digits). The least significant digit or bit (LSB) of the retained portion is $N_a$, while the most significant digit or bit (MSB) of the discarded portion is $N_x$. For positive numbers, and for both sign-magnitude and twos-complement arithmetic, truncation is the process whereby the discarded portion of N is simply discarded, and the retained portion is retained, intact and unchanged. By way of comparison, in rounding, a determination is required to see if the value of $N_x$ is greater than or equl to half of the maximum value that $N_x$ may assume. If so, N is rounded up by increasing the value of $N_a$ by one and discarding $N_{x,y,z} \ldots$; if not, N is rounded down by simple truncation, as discussed above. As an example, in decimal (base ten) notation, the number 238.3976 is both rounded and truncated to 238; the number 257.5931 is truncated to 257 but rounded to 258, since the MSB of the discarded portion is greater than or equal to $\frac{1}{2} \times 9 = 4.5$.

In binary notation, the above convention is also true, again assuming positive numbers, irrespective of the type of arithmetic used. For example, the number 10110.001 (22.125 in base 10) is both rounded and truncated to 10110 (22 in base 10). However, the number 10110.101 ($22.625_{10}$) is truncated to 10110 but rounded to 10111 ($23_{10}$), since the MSB of the discarded portion is a "1".

While the characteristics of sign-magnitude and two's-complement arithmetic are the same for positive numbers, such is not the case for negative numbers. For rounding, the difference is only at the $-N.5$ points, i.e., $-N.5$ sign-magnitude numbers round to $-(N+1)$ while $-N.5$ two's-complement numbers round to $-N$. For truncation, the difference is more significant: in sign-magnitude, the number $-N_a.N_x$ is truncated to $-N_a$, but for two's-complement, $-N_a \cdot N_z$ is truncated to $-(N_a+1)$. As an example of the latter difference, in sign-magnitude arithmetic, $-5.2$ is truncated to $-5$, while it is truncated to $-6$ in two's-complement airthmetic.

The digital multiplier circuit shown in FIG. 2 of the Kieburtz et al patent is, in fact, arranged to produce rounding rather than truncation, when the R signal designated in that patent is a logical "1". Also this multiplier is arranged for sign-magnitude arithmetic. See, specifically, column 2, lines 47–62. On the other hand, if the R signal is removed, truncation occurs. As stated above, the essence of the Kieburtz invention is to randomly remove the R signal to reduce limit cycles in the filter.

Returning now to the previous discussion regarding the nature of limit cycles in the filter of FIG. 1a, an illustrative example will be helpful. Assume a zero input to the filter ($X(n)=0$), initial state variables $D_1 = 8$ and $D_2 = 8$, and multiplier coefficients $B_1 = -1.84375$ and $B_2 = 0.9375$. Also assume pure rounding in multipliers 100 and 101. Under these conditions, the first filter output using equation (1) is given by:

$$Y = -(-1.84375)(8) - (0.9375)(8) + 0$$

$$= (14.75 \overset{R}{\to} 15) - (7.5 \overset{R}{\to} 8) + 0$$

$$= 7,$$

where the symbol $\overset{R}{\to}$ represents rounding. In the next cycle of filter operation, the variables become $D_1 = 7$ and $D_2 = 8$; the output is thus $Y = -(-1.84375)(7))-(0.9375)(8) = (12.90625 \overset{R}{\to} 13) - (7.5 \overset{R}{\to} 8) = 5$. As operation continues, the limit cycle illustrated in the following table is thus generated:

TABLE 1

| Cycle | $D_1$ | $D_2$ | Y |
|---|---|---|---|
| Initial Condition | 8 | 8 | 7 |
| 2 | 7 | 8 | 5 |
| 3 | 5 | 7 | 2 |
| 4 | 2 | 5 | −1 |
| 5 | −1 | 2 | −4 |
| 6 | −4 | −1 | −6 |
| 7 | −6 | −4 | −7 |
| 8 | −7 | −6 | −7 |
| 9 | −7 | −7 | −6 |
| 10 | −6 | −7 | −4 |
| 11 | −4 | −6 | −1 |
| 12 | −1 | −4 | 2 |
| 13 | 2 | −1 | 5 |
| 14 | 5 | 2 | 7 |
| 15 | 7 | 5 | 8 |
| 16 | 8 | 7 | 8 |
| Initial | 8 | 8 | Cycle Repeats. |

As will be seen from the foregoing table, the limit cycle generated from the initial condition $D_1 = D_2 = 8$ has a length of 16 and a peak to peak amplitude of 15. It also will be seen that $D_1$ is a delayed version of Y, and $D_2$ is a delayed version of $D_1$. Accordingly, in the following table of other limit cycles possible for the above values of $B_1$ and $B_2$, only the value of $D_1$ is specified:

TABLE 2

| Cycle | Initial condition $D_1 = D_2 =$ | | | |
|---|---|---|---|---|
| | 7 | 6 | 5 | 4 |
| 2 | 6 | 5 | 4 | 3 |
| 3 | 4 | 3 | 2 | 2 |
| 4 | 1 | 1 | 0 | 1 |
| 5 | −2 | −1 | −2 | 0 |
| 6 | −5 | −3 | −4 | −1 |
| 7 | −7 | −5 | −5 | −2 |
| 8 | −8 | −6 | −5 | −3 |
| 9 | −8 | −6 | −4 | −4 |

TABLE 2-continued

| Cycle | Initial condition $D_1 = D_2 =$ | | | |
|---|---|---|---|---|
| | 7 | 6 | 5 | 4 |
| 10 | −7 | −5 | −2 | −4 |
| 11 | −5 | −3 | 0 | −3 |
| 12 | −2 | −1 | 2 | −2 |
| 13 | 1 | 1 | 4 | −1 |
| 14 | 4 | 3 | 5 | 0 |
| 15 | 6 | 5 | | 1 |
| 16 | 7 | 6 | | 2 |
| 17 | | | | 3 |
| 18 | | | | 4 |
| Length | 16 | 16 | 14 | 18 |
| Peak to Peak Amplitude | 15 | 12 | 10 | 8 |

Figure 3:
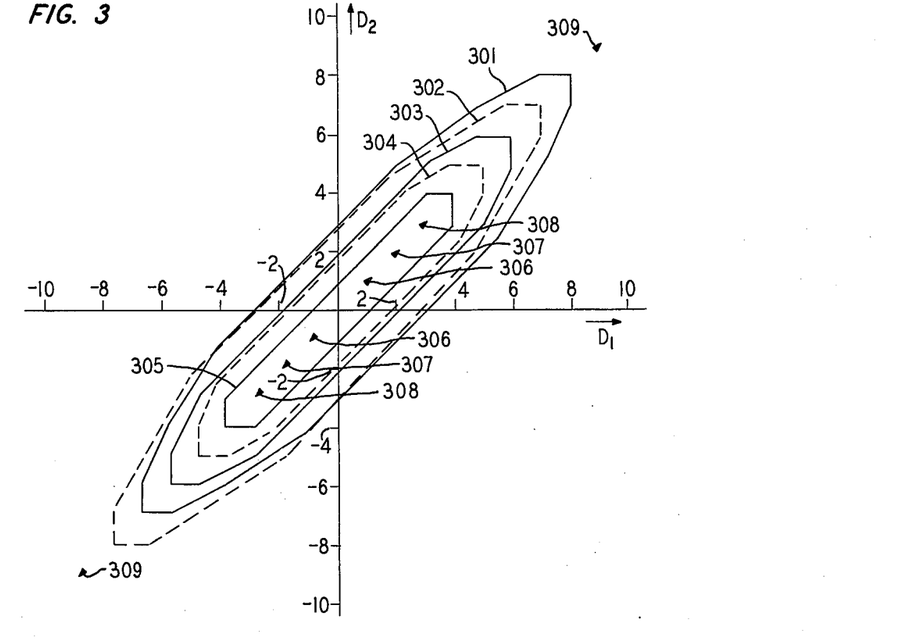
FIG. 3 is a pseudo phase plane plot showing various limit cycles which may occur in the filters of FIGS. 1a and 1b.

A most useful representation of the limit cycles described in the above tables is shown in FIG. 3, which is a plot of the current value $D_1(n)$ [horizontal axis] versus the previous value $D_2(n)$ [vertical axis]. This plot, sometimes referred to as the pseudo phase plane plot, is hereafter referred to simply as the $D_1$-$D_2$ plot.

In FIG. 3, curve 301 represents the limit cycle specified in Table 1 above. Curves 302–305 represent the limit cycles of columns 1–4 of Table 2, respectively. Points 306–309 represent DC limit cycles which occur for $D_1 = D_2 = \pm 1, \pm 2, \pm 3,$ and $\pm 9$, respectively. For example, for $D_1 = D_2 = \pm 2$, $$Y = (-B_1)D_1 + (-B_2)D_2 + X$$

$$= (1.84375)(2) + (-0.9375)(2)$$

$$= (3.6875 \overset{R}{\to} 4) - (1.875 \overset{R}{\to} 2)$$

$$= 4 - 2$$

$$= 2,$$

which means that the filter output remains stationary at 2.

It is possible, in accordance with known techniques, to avoid the limit cycles 301–305 of FIG. 3 simply by truncating, rather than rounding the products at the outputs of both multipliers 100 and 101. For example, for $D_1 = D_2 = 8$, the succeeding values of Y, the filter output, are 7, 5, 3, 1, −1, and 0, at which time the filter output remains at 0. However, the pure truncation approach suffers from a number of defects. First, the quantization errors in the presence of a signal increase. Second, DC and half sampling rate limit cycles are not eliminated by truncation so that arbitrary limit cycles can still occur, for example, in a cascade of second order sections with the previous section producing a DC limit cycle.

To minimize the effect of quantization noise in the presence of signals and suppress limit cycles as well, the aforementioned Kieburtz et al approach uses random truncation of the $B_2D_2$ product. However, though this method is partially effective, it still allows the existence of DC and half sample rate ($Fs/2$) limit cycles; furthermore, the squelch time (the number of steps required to converge to DC or $Fs/2$) for such an arrangement is greater than the squelch time using the present invention.

Since most limit cycles are produced by quantization error sequences that are highly correlated, the present invention takes cognizance of the fact that purely stochastic methods are not the optimum means of suppressing them. Rather, applicants use a pseudo-random or partly deterministic approach to achieve rapid suppression of limit cycles. In this approach, constrained random truncation of the $B_2D_2$ product (or sometimes the $B_1D_1$ product or both products) is used to reduce the squelch time of the limit cycles and to guarantee their convergence. Related techniques are used for detection and suppression of DC and $Fs/2$ limit cycles. This approach thus takes cognizance of the fact that if random truncation of the $B_2D_2$ product is allowed freely, without constraint, there are often situations where a larger limit cycle may result. This, of course, can lead to an undesirable oscillatory effect (i.e., moving from a smaller to a larger limit cycle, and vice-versa).

Figure 4:
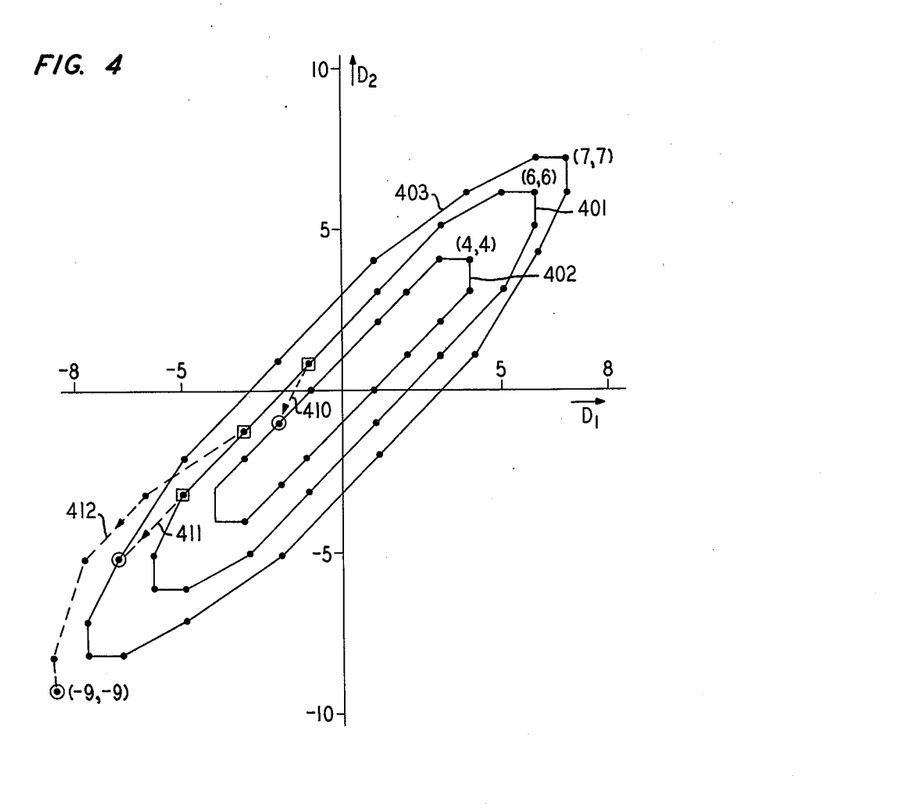
FIG. 4 is a plot similar to FIG. 3 showing transitional paths between limit cycles.

The necessity for constraints in accordance with the invention is best illustrated by the following example. For the limit cycles previously shown in FIG. 3, FIG. 4 shows the effect of truncating the $B_2D_2$ product for three states; namely, $(-1,1)$, $(-3,-1)$ and $(-5,-3)$, which states all lie on the limit cycle 401 defined by the initial (6,6) state. Truncating the $B_2D_2$ product from the state $(-1,1)$ produces the transitional path 410 to the state $(-2,-1)$, which is desirable since it results in a step down to the smaller limit cycle 402 defined by the initial state (4,4). However, truncation of the $B_2D_2$ product from the state $(-5,-3)$ produces a transitional path 411 to the state $(-7,-5)$, which is undesirable since it results in a step up to the bigger limit cycle 403 defined by the initial state (7,7). Also, the transitional path 412 which is produced from $(-3,-1)$ is similarly undesirable, since it results in a 4-step transient leading to the DC limit cycle of $(-9,-9)$, which state cannot be changed by random truncation of the $B_2D_2$ product. Clearly, then, it is demonstrated that there are certain states for which random truncation is helpful, but, unfortunately, there are other states for which random truncation is harmful. The identification and elimination of the latter is, of course, the subject of the present invention.

The nature of the constraints used in the invention are best understood via the $D_1$-$D_2$ plane plot of the limit cycle. In general, the desired result is to ensure that truncation only causes a shift from an existing limit cycle to a new state which is within, or, at worst on, the old limit cycle curve. (For example, in FIG. 4, transition 410 is to be allowed, while transitions 411 and 412 are to be prevented.) For ease of understanding, the specific constraints are derived below for the four different combinations of signs of $B_1$ and $B_2$.

a. Positive $B_2$ and Negative $B_1$ (low frequency poles)

Figure 5:
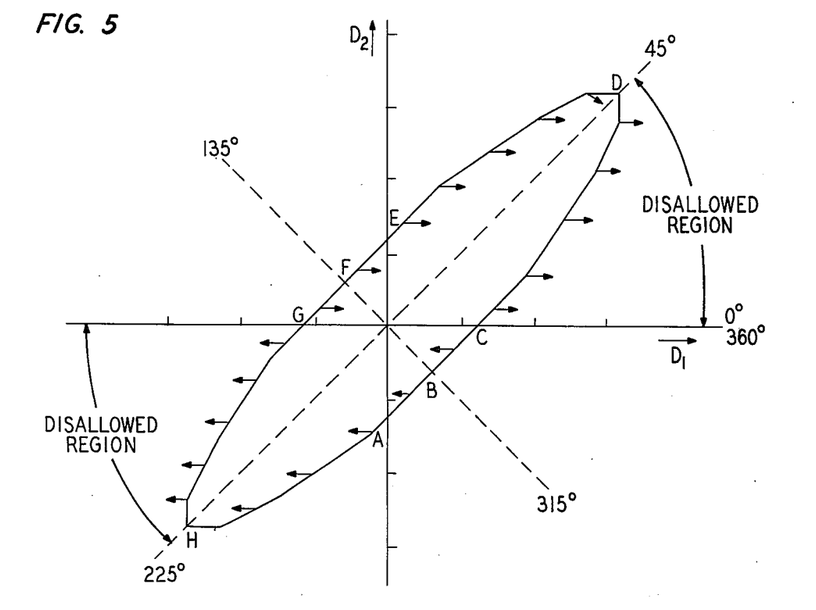
FIG. 5 is a $D_1$-$D_2$ plot of a generalized limit cycle if $B_2$ is positive and $B_1$ is negative.

For the case of $B_2$ positive and $B_1$ negative, a $D_1$-$D_2$ plot of a generalized limit cycle is shown in FIG. 5. In this figure, the small arrows symbolize the effective movement due to truncation without constraints (provided the $B_2D_2$ product rounds up). Stated differently, the next value $D_1(n+1) = Y(n)$, which results after truncation, shifts in the direction of the arrows in FIG. 5, at least for the usual case where consecutive states are close together.

To accomplish the goal stated above, namely, to allow truncation only when it is not harmful, visual inspection of FIG. 5 reveals that the constraints desired are to allow truncation only if $$\text{Sign } D_1 \neq \text{Sign } D_2, \quad (4)$$

or $$\text{Magnitude } D_2 > \text{Magnitude } D_1. \quad (5)$$

In other words, the disallowed regions (i.e., regions in which truncation should not be permitted) are from 0° to 45° and from 180° to 225°. By disallowing truncation in these regions, movement to a larger limit cycle is avoided, while movement to a smaller (or equal) limit cycle is permitted.

It should be pointed out that a simplified version of the above constraints can be used if a simplified implementation (to be discussed hereinafter) is desired. For example, the constraint of only equation (4) can be used, in which case the arcs ABC and EFG would be allowed. Alternatively, the constraint of only equation (5) can be used, in which case the arcs DEF and HAB would be permitted. The use of equation (5) alone is almost as effective as the full constraints using equations (4) and (5).

b. Positive $B_2$ and $B_1$ (high frequency poles)

Figure 6:
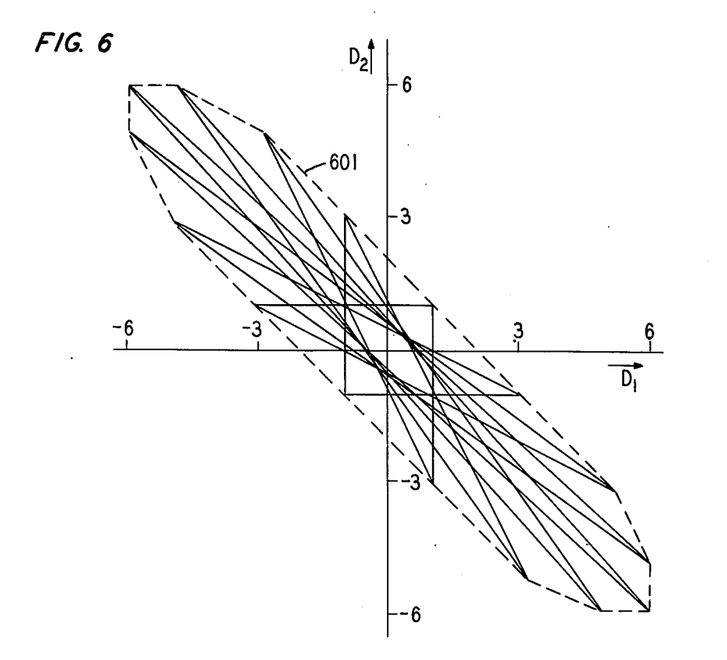
FIG. 6 is a $D_1$-$D_2$ plot of a generalized limit cycle if both $B_1$ and $B_2$ are positive.

For positive $B_1$ and $B_2$, the character of the limit cycles changed in two significant ways. First, consecutive values of $D_1$ tend to alternate in sign. When the consecutive states in the $D_1$-$D_2$ plane are connected, the starlike pattern shown in FIG. 6 appears. (In FIG. 6, $B_1 = 1.84375$ and $B_2 = 0.9375$). Second, the major axis of the FIG. 6 plot is in the second and fourth quadrants.

Since the constraint strategy of the present invention refers to the "inside" of the $D_1$-$D_2$ limit cycle plot, an appropriate definition of the star shaped plot is made by connecting the states in the next-nearest neighborhood sense, as shown by the closed figure defined by dotted line 601. FIG. 6 is redrawn in FIG. 7, in which symbolic arrows again indicate the direction of movement to the next state, again assuming truncation without constraint. In this case, the arrows are constructed by realizing that, typically, the states oscillate between the second and fourth quadrants so that the sign of $D_2$ reverses at each sample interval. Accordingly, the direction of the arrow at the current state depends upon the sign of the previous $D_2$ value: If the current $D_2$ is positive, the arrows point to the left, while if the current $D_2$ is negative, the arrows point to the right.

Figure 7:
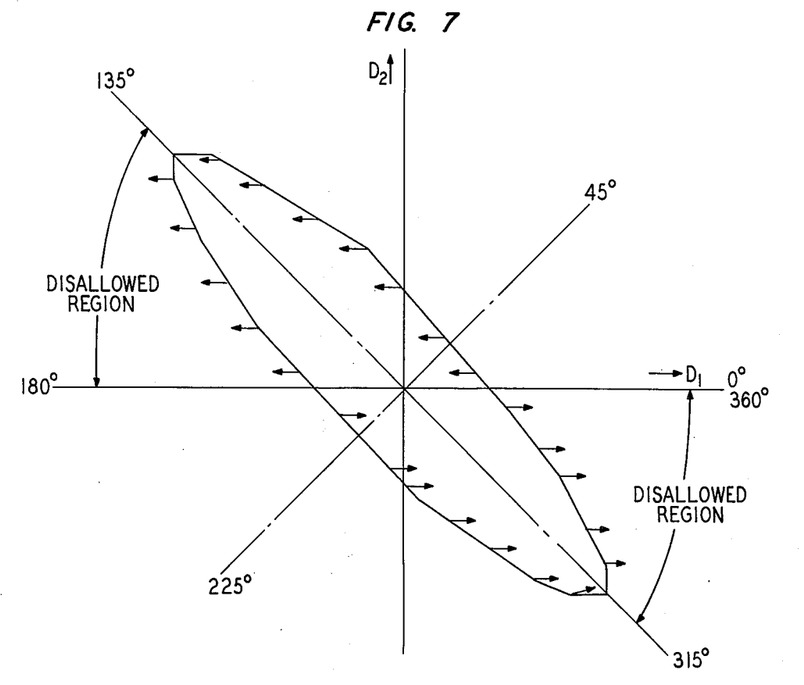
FIG. 7 is a $D_1$-$D_2$ plot showing the closed curve formed when the neighboring points in FIG. 6 are connected.

For the situation described above, the constraints in accordance with the invention are to allow truncation only if:

$$\text{Sign } D_1 = \text{Sign } D_2, \quad (6)$$

or $$\text{Mangitude } D_2 > \text{Magnitude } D_1. \quad (7)$$

The disallowed regions are thus from 135° to 180° and from 315° to 360°. As before, simpler constraints may be used, with equation (7) being more effective than equation (6).

c. Negative $B_2$

For either sign of $B_1$ with $B_2 < 0$, the poles are real, with one pole on each side of the origin. The only limit cycles thought to exist are DC or half sampling rate cycles. Truncation without constraint can be used to suppress these cycles, provided the $B_2D_2$ product rounds up. However, such is not always the case, and the subsequent discussion will describe circuitry which is effective for all DC or $Fs/2$ limit cycles, whether or not $B_2D_2$ product rounds up.

d. $B_1$ effectively zero

Figure 8:
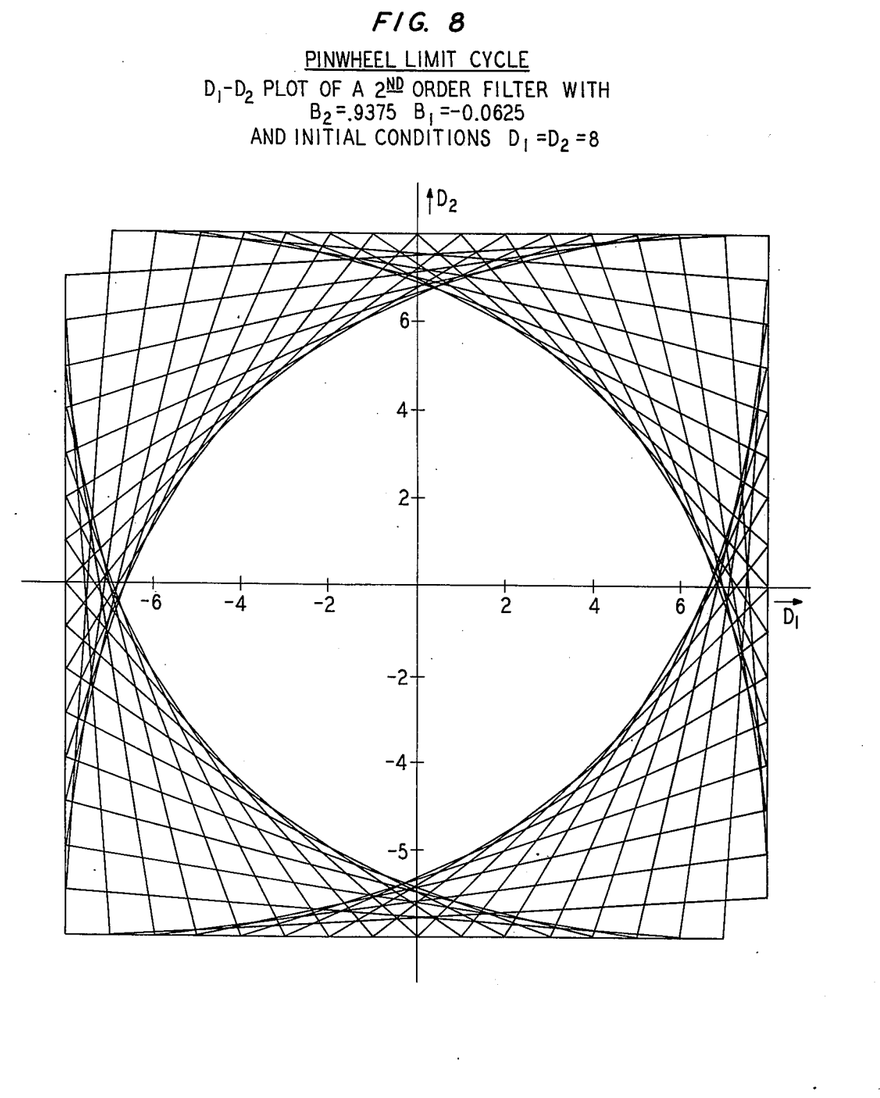
FIG. 8 is a $D_1$-$D_2$ plot of a generalized limit cycle if $B_1$ is close to zero.

When $B_1$ is nearly zero, the rounding operation makes it equivalent to a zero coefficient. Two common limit cycles known to occur in this arrangement are quarter sampling rate limit cycles, and "pinwheel" limit cycles. The latter consists of nearly ¼ rate limit cycles, except that the $D_1$-$D_2$ states miss by one in closure. As a result, multilayered $D_1$-$D_2$ plot occurs as the closure state precesses around the $D_1$-$D_2$ plane; the limit cycle thus produced is very long. An example of a pinwheel limit cycle is shown in FIG. 8 for $B_2 = 0.9375$ and $B_1 = -0.0625$.

For the pinwheel and ¼ rate limit cycles, pure truncation results in movement to another state on the same limit cycle or an equivalent amplitude limit cycle. Accordingly, for this situation, there are no disallowed regions. Stated differently, for the case of $B_1 \approx 0$, random truncation without constraint is sufficient to eliminate limit cycles.

The foregoing analysis can be simply stated as follows: Truncation is to be allowed in the $B_2$ multiplier 101 of FIG. 1a, based upon the relative magnitude of $D_1$ and $D_2$, the polarity relation between $D_1$ and $D_2$, and the polarity (sign) of the $B_1$ coefficient The following table further illustrates the foregoing:

TABLE 3

| $B_1$ | $|D_2| > |D_1|$ | Sign $D_1$ = Sign $D_2$ | Trucation Allowed | Line |
|---|---|---|---|---|
| + | Yes | — | Yes | 1 |
| — | | Yes | Yes | 2 |
| + | No | No | No | 3 |
| — | | Yes | No | 4 |
| | | No | Yes | 5 |

Figure 9:
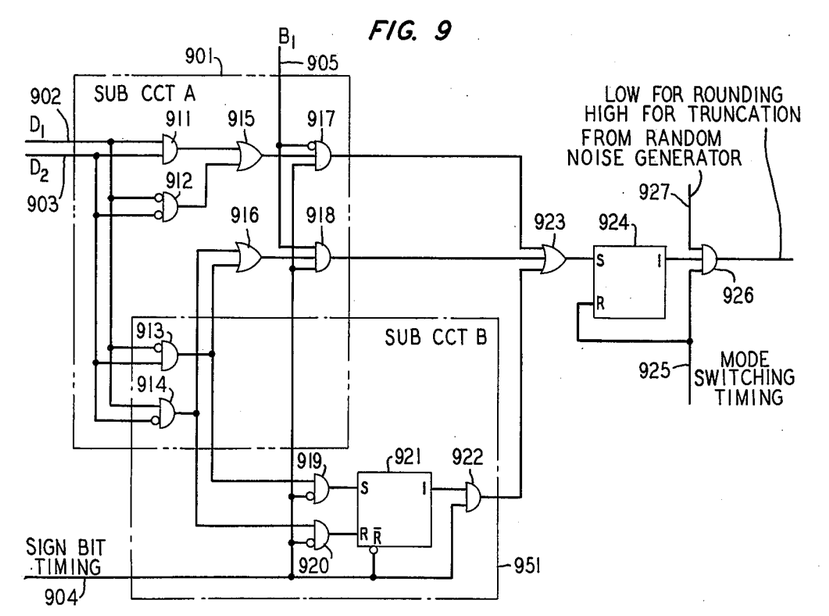
FIG. 9 is a logic diagram showing circuitry in accordance with the invention for eliminating limit cycles in the filters of FIGS. 1a and 1b.

For the case of serial data flow in sign-magnitude format (with a 0 in the sign bit representing a positive number and a 1 in the sign bit representing a negative number), one embodiment of logic circuitry that can be used to implement the above strategy is shown in FIG. 9. The circuitry within box 901 is designed to test the signal or polarity constraint, while the circuitry within box 951 is designed to test the magnitude constraint.

In the sign constraint circuitry 901, the $D_1$ signal input on line 902 is coupled to one of the input terminals of AND gates 911 and 914, and in inverted form to one of the input terminals of AND gates 912 and 913. The $D_2$ signal input on line 903 is applied to the other input terminals of AND gates 911 and 913, and in inverted form to the other input terminals of AND gates 912 and 914. Accordingly, the output of AND gate 912 is high if both $D_1$ and $D_2$ positive, the output of AND gate 911 is high if both $D_1$ and $D_2$ are negative, and the outputs of either AND gate 913 or 914 is high if the signs of $D_1$ and $D_2$ are different. The outputs of gates 911 and 912 are ORed in OR gate 915, the output of which is high if the signs of $D_1$ and $D_2$ are the same. The outputs of gates 913 and 914 are ORed in OR gate 916, the output of which is high if the signs of $D_1$ and $D_2$ are different.

The output of gate 915 is applied to one input of AND gate 917; a second input to gate 917 is a sign bit timing pulse received from line 904. The third input of gate 917 is derived from the $B_1$ line 905, which is inverted. Accordingly, it will be seen that the output of gate 917 is high at the occurrence of a sign bit only if (a) $B_1$ has a sign bit of 0, representing a positive sign, and (b) sign $D_1$ = sign $D_2$, thereby satisfying the conditions on line 2 of Table 3. In a similar fashion, the output of gate 916 is applied to one input terminal of AND gate 918; a second input to gate 918 is a sign bit timing pulse from line 904. The third input to gate 918 is derived from the $B_1$ line 905, but is not inverted. Accordingly, it will be seen that the output of gate 918 is high at the occurrence of a sign bit only if (a) $B_1$ has a sign bit of 1, representing a negative sign, and (b) sign $D_1 \ne$ sign $D_2$, thereby satisfying the conditions on line 5 of Table 3.

In the magnitude constraint circuitry 951, the output of gate 913 is coupled to one input of AND gate 919, and the output of gate 914 is coupled to one input of AND gate 920. The remaining inputs to gates 919 and 920 are inverted inputs derived from the line 904 sign bit timing pulse. The output of gate 919 is applied to the set input of a flip-flop 921, while the output of gate 920 is applied to the reset input of the same flip-flop. In addition, the line 904 sign bit timing pulse is inverted and applied to an $\overline{R}$ input to flip-flop 921, which signal is arranged to reset the flip-flop on the trailing edge of the pulse. Accordingly, it will be seen that flip-flop 921 does a magnitude comparison between $D_2$ and $D_1$ on a bit serial basis (sign bit information is excluded from the comparison by virtue of the inverted inputs to gates 919 and 920). Accordingly, when flip-flop 921 is in a set condition just prior ro the sign bit time, $D_2$ is greater than $D_1$. The flip-flop is then reset by the $\overline{R}$ input, and the next comparison proceeds in a similar manner. The output of flip-flop 921 is applied to one input of AND gate 922, the other input of which is coupled to line 904. The output of gate 922 therefore satisfies the conditions of line 1 of Table 3.

The outputs of AND gates 917, 918 and 922 are each applied to an OR gate 923, which is connected to the set input of a second flip-flop 924. The latter flip-flop is a timing buffer that is set when the constraints are satisfied, and reset when a mode switching timing pulse is received on line 925. The output of flip-flop 924 is coupled to one input of an AND gate 926. A second input to gate 926 is derived from a random noise generator (such as noise generator 300 in FIG. 3 of the aforesaid Kieburtz et al patent) via line 927. The third input to gate 926 is supplied from line 925, which carries the mode switching timing pulse. Accordingly, the output of AND gate 926 represents a control signal which is randomly high (for truncation), but under the control of the constraints of the present invention. In the setting of FIG. 3 of the Kieburtz et al. patent, the signal would be inverted in an inverter (not shown) and applied to AND gate 302 in lieu of the output from flip-flop 301 shown in that figure.

In the logic circuitry of FIG. 9, no attempt has been made to avoid logical race conditions, since this may easily be done by those skilled in the art. If the circuit delays are properly arranged, it may be possible to avoid the need for flip-flop 924. For implementation of the magnitude constraint alone, gates 911, 912, 915, 916, 917 and 918 may, of course, be eliminated.

Before proceeding with the description of another aspect of the present invention, it is important to note here that the logic circuit of FIG. 9 is but one possible way of implementing the constraints shown in Table 3, and that many alternative arrangements are possible. For example, $D_1$ and $D_2$ have previously been defined as versions of the filter output that are removed in time by one and two sample intervals, respectively; in the form of filter shown in FIG. 1a, removal in time was specified as a delay of the output Y(n), and the $D_1$ and $D_2$ versions were conveniently available at points within the filter, specifically $D_1$ at the input to delay circuit 110 and $D_2$ at the output of delay circuit 110. However, instead of using the $D_1$ and $D_2$ signals from within the filter, it is also possible to monitor successive outputs Y(n) of the filter with external memory circuitry connected to point 121 of FIG. 1a, since these outputs are also removed in time from each other by one sample interval. However, if the latter approach is taken, the cost of the extra memory capacity adds significantly to the overall cost of the logic required, with no gain in performance.

Figure 1B:
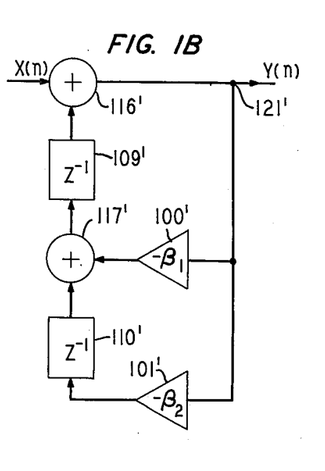
FIG. 1b is a similar diagram of another form of filter section.

In addition to the foregoing, it is to be understood that the present invention works equally well with forms of second order recursive filters other than the form shown in FIG. 1a. Specifically, one alternative form is shown in FIG. 1b, which, like FIG. 1a, includes two delay elements 109' and 110' having transfer functions $Z^{-1}$, two digital multipliers 100' and 101' having multiplier coefficients $-B_1$ and $-B_2$, respectively, and two adder circuits 116' and 117'. For comparison purposes, the components of FIG. 1b retain the same designations as those of FIG. 1a but with primes added.

The output of Y(n) of the filter of FIG. 1b at point 121' is applied to multiplier 100' and thence, via adder 117', to delay circuit 109'. Thus, the output of circuit 109' derived from the first feedback loop (comprising circuit 109' and multiplier 100') is given by $B_1D_1$, where, as before, $D_1 = Y(n-1)$. The output at point 121' is also applied to the multiplier 101' and thence to delay circuits 110' and 109'. Accordingly, the output of circuit 109' derived from the second feedback loop (comprising circuit 110' and multiplier 101') is given by $B_2D_2$, where, as before, $D_2 = Y(n-2) = D_1(n-1)$. The output of circuit 109' is combined with the filter input X(n) in adder 116'. The output of the adder, which is the filter output Y(n), thus is the same as equation (1) hereinabove.

For the form of filter shown in FIG. 1b, the $D_1$ and $D_2$ signals required for input lines 902 and 903 of FIG. 9 are derived from the input and output of delay circuit 109', respectively.

As will be apparent to those skilled in the art, second order recursive digital filters may take still other forms in addition to those shown in FIGS. 1a and 1b, and the present invention may be practiced with these forms as well. However, in the most generic sense, each such form must include requisite delay means, multipliers, quantizing means and summing means, so that the output equation (1) is satisfied, even though the terms $B_1$ and $B_2$ in that equation may be only algebraically related to the actual coefficients of the multipliers employed in the filter, and the terms $D_1$ and $D_2$ may not be present at the input and output terminals of a single delay element. Nevertheless, in these additional forms, the present invention may be practiced by constraining the random truncation of the product formed in at least one of the multipliers to those instances in which a larger limit cycle is not produced.

Turning now to another aspect of the present invention, it was stated above that second order recursive digital filters of the types shown in FIGS. 1a and 1b often have $Fs/2$ or DC limit cycles, or both, and that these limit cycles have special properties that make suppression more difficult. Specifically, limit cycles may exist when neither, either or both of the $B_1D_1$ and $B_2D_2$ products are rounding up. In the example shown in FIG. 3, the DC state of 9,9 involved $B_1D_1$ rounding up and $B_2D_2$ rounding down. Clearly, random truncation of $B_2D_2$ will thus have no control over this limit cycle. In fact, for many cases, random truncation will pop the filter into a larger limit cycle of a type with more than two states.

In order to eliminate DC and $Fs/2$ limit cycles, the present invention provides means for detecting their presence by comparing the magnitudes of $D_1$ and $D_2$ in two consecutive transitions. (This is equivalent to comparing three consecutive values of $D_1$.) Whenever all three magnitudes are equal, a DC or $Fs/2$ limit cycle is assumed to exist; the limit cycle is then eliminated by reducing the magnitude of the next $D_1$ by one.

Figure 10:
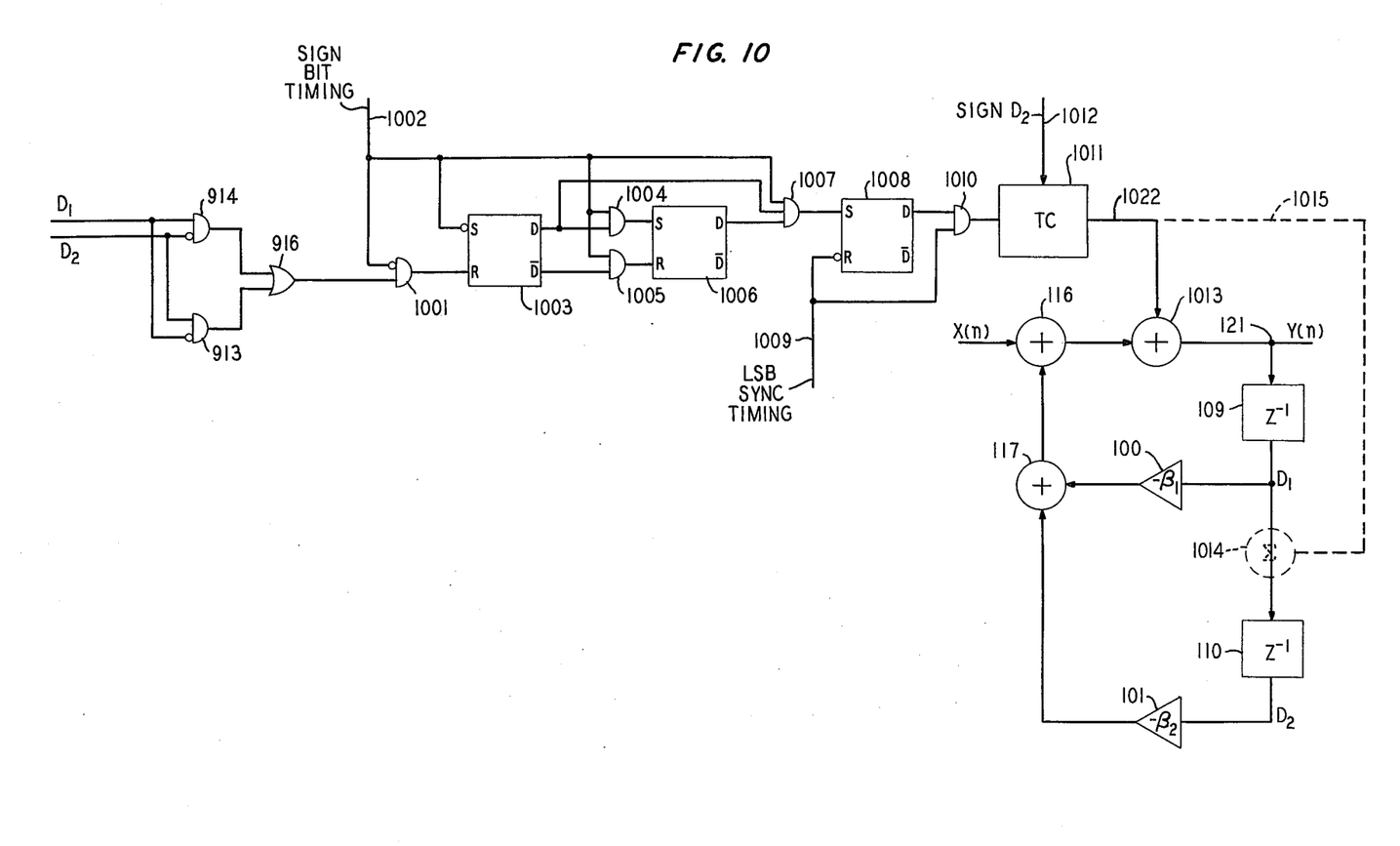
FIG. 10 is a logic diagram showing circuitry in accordance with the invention for eliminating dc and $Fs/2$ limit cycles.

Since the magnitudes of $D_1$ and $D_2$ are already examined in the circuitry of FIG. 9, the additional circuitry needed to detect three equal magnitudes of $D_1$ is not large: all that is needed is an extra memory to bridge two consecutive transitions. One embodiment of such circuitry is depicted in FIG. 10. As shown, AND gates 913 and 914 and OR gate 916 (all of which are part of the circuitry of FIG. 9) are arranged to produce a high output from gate 916 if the $D_1$ and $D_2$ inputs are different. The output of gate 916 is connected to one input of an AND gate 1001 and the inverted sign bit timing pulse derived from line 1002 is connected to the other input thereof. Accordingly, for time intervals other than the sign bit, (i.e., magnitude portion of a word) the output of AND gate 1001 is high if $|D_1| \neq |D_2|$.

Flip-flop 1003 is set when the sign bit timing pulse is absent, and reset when the output of gate 1001 is high. Accordingly, the DATA output of flip-flop 1003 is high if a first match between $|D_1|$ and $|D_2|$ exists, and this high is extended through AND gate 1004 at the next occurrence of a sign bit timing pulse on line 1002, to set a second flip-flop 1006. Alternatively, if flip-flop 1003 is not set, its $\overline{\text{DATA}}$ output is extended through AND gate 1005 at the next occurrence of a sign bit timing pulse so as to reset flip-flop 1006.

The DATA output of flip-flop 1006 is coupled to a first input of AND gate 1007, and the DATA output of flip-flop 1003 is coupled to a second input of gate 1007. The third input of AND gate 1007 is received from the sign bit timing pulse on line 1002. Thus, it will be seen that the output of gate 1007 will go high only if (a) $|D_1| = |D_2|$ in the present state, as indicated by a set condition of flip-flop 1003, and (b) $|D_1| = |D_2|$ in the previous state, as indicated by a set condition of flip-flop 1006. Stated differently, the output of AND gate 1007 is only high if the magnitudes of $D_1$ and $D_2$ are equal in two consecutive transitions, indicating the presence of a DC or $Fs/2$ limit cycle.

The output of AND gate 1007 is used to set a third flip-flop 1008, which is reset after the occurrence of a SYNC pulse on line 1009. The latter pulse is arranged to occur at the end of the processing of each word in the second order filter section, and can be produced by standard timing circuitry not shown. The DATA output of flip-flop 1008 is in turn passed through AND gate 1010 at the occurrence of the SYNC pulse, and applied to a two's complementor 1011 which is arranged, in standard fashion, to generate a binary word which has a magnitude of "1". The sign of the two's complementor 1011 output is controlled by the sign of $D_2$ which appears on line 1012: if $D_2$ is positive, the output of complementor 1011 is negative, and vice-versa. Finally, the output of complementor 1011 on line 1022 is applied to one input of an adder circuit 1013 disposed in the forward loop of the digital filter of FIG. 1, which is shown again in FIG. 10 retaining the same reference designations. The other input to adder 1013 is derived from the output of adder 116, while the output of adder 1013 is coupled to point 121, the output of the recursive section. Thus, in the presence of a DC or Fs/2 limit cycle, as indicated by the presence of consecutive transitions in which $|D_1| = |D_2|$, the magnitude of the input X(n) is decreased by one.

While the just described DC and Fs/2 squelch circuitry is guaranteed to eventually drive all sections to the null state, it does not avoid the problem of jumping temporarily from a DC state to the next largest oscillating limit cycle. The only way to proceed directly to the null state is to reduce both the current $D_1$ and the next $D_1$ (i.e., the current output Y(n)) by one in magnitude, thus moving the limit cycle along a 45° line toward the origin in the $D_1$-$D_2$ plane plot. This refinement is accomplished for DC elimination simply by the provision of an additional adder circuit 1014 (shown dotted) in the second order feedback loop just prior to the delay circuit 110. This adder receives one input from the output of delay circuit 109, and its other input from complementor 1011 via line 1015, also shown dotted. However, it is to be noted that this arrangement does introduce errors in the presence of signal, whenever three consecutive magnitudes are equal; these errors would likely be insignificant. For Fs/2 elimination, an additional two's complementor (not shown) must be inserted in line 1015 just prior to adder 1014.

Figure 11:
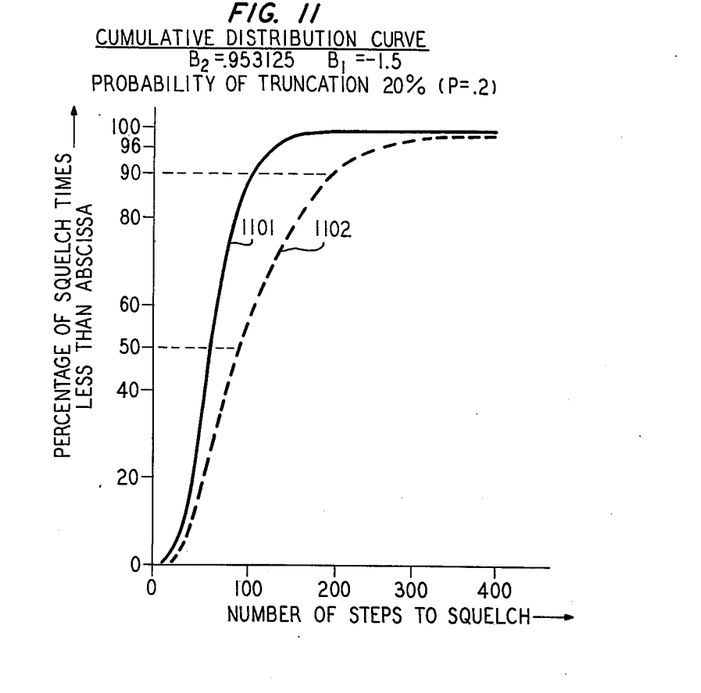
FIGS. 11–14 are graphs showing the advantages of the present invention over unconstrained random truncation, for various values of $B_1$ and $B_2$.
Figure 12:
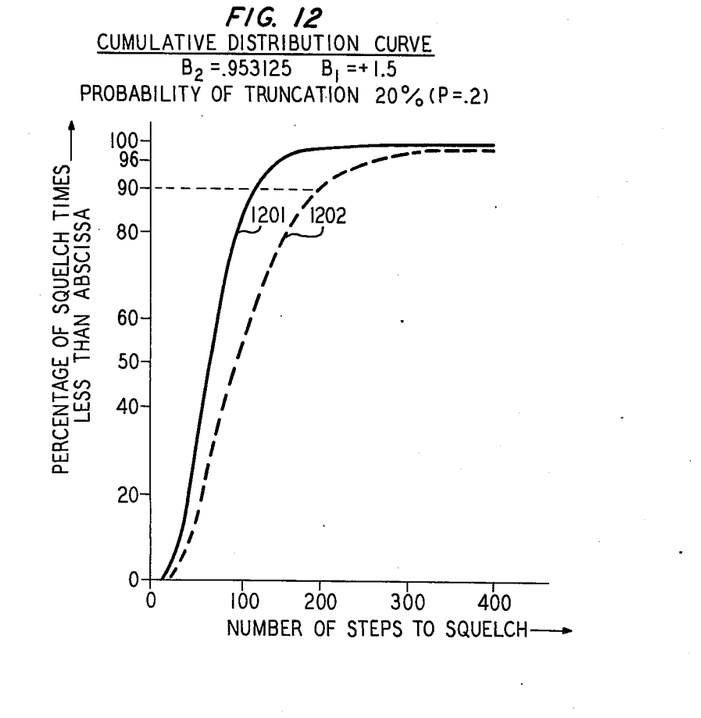

The advantages of the constrained truncation technique and the DC and Fs/2 elimination technique were confirmed by statistical studies which compared their performance with that of a filter using the random trunaction technique of the Kieburtz et al patent. Four different pole pairs were studied, with either 10 percent or 20 percent probability of truncation. Measurements were made of the number of steps from a given initial condition on a limit cycle to the null state. The simulation was carried out by programming the second order section on a computer. The section was initialized to a fixed state $(D_1,D_2)$ on the largest limit cycle for the poles under study, and stepped until the null state was reach or 400 steps occurred. Truncation of the $B_2D_2$ product was done with 10 percent or 20 percent probability using the random number generator supplied with the software system. The test was repeated 1000 times for each situation and the results are shown as the cumulative distribution curves in FIGS. 11–14. FIG. 11 shows the curves for $B_2 = 0.953125$ and $B_1 = -1.5$ with $p = 0.2$ (20 percent probability of truncation). Curve 1101 is for constrained truncation in accordance with the invention, while curve 1102 shows the results of unconstrained random truncation. FIG. 12 shows the curves for the same variables as FIG. 11, except $B_1$ is +1.5; curve 1201 is for operation in accordance with the invention while curve 1202 shows results of the Kieburtz technique. Both FIGS. 11 and 12 demonstrate the improvement of the constrained over the unconstrained techniques. The similarity of these two FIGS. supports the thesis that symmetrical low frequency and high frequency poles lead to effectively the same limit cycle problems.

Figure 13:
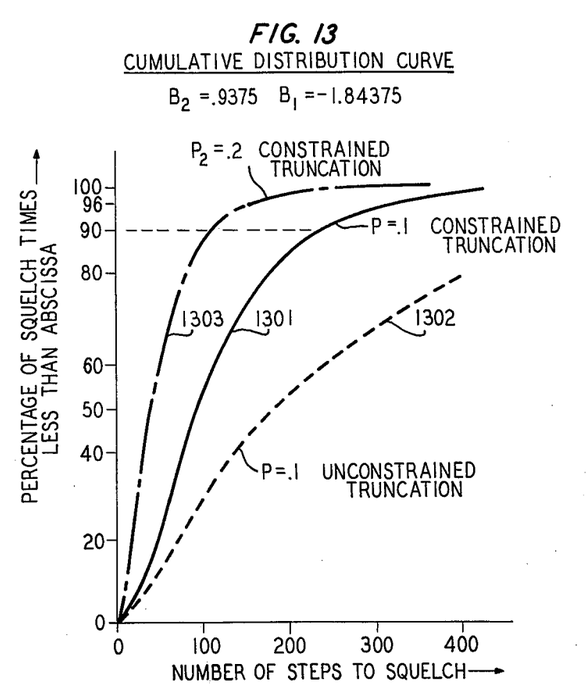

FIG. 13 shows the comparison between the constrained and unconstrained techniques for $B_2 = 0.9375$, $B_1 = -1.84375$ and $p = 0.1$ (10 percent probability of truncation). The improvement is again obvious from the curves (1301 is constrained, 1302 is not). In addition, this FIG. shows the curve 1303 for the constrained technique for $p = 0.2$. The approximate 2:1 improvement of the 20 percent over the 10 percent probability of truncation is as expected.

Figure 14:
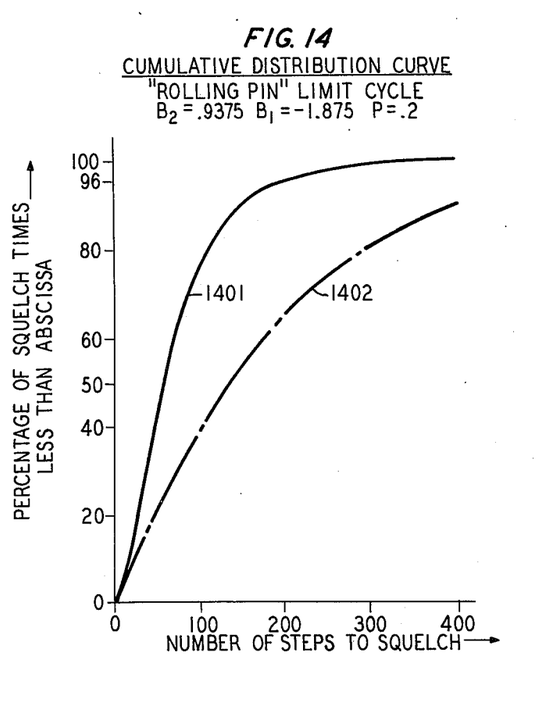

Though the previous pair of coefficients ($B_2 = 0.9375$ $B_1 = -1.84375$), was chosen arbitrarily for this study, a slight variation in the $B_1$ coefficient from −1.84375 to −1.875 (with $B_2$ fixed), leads to the occurrence of a "rolling pin" limit cycle whose peak amplitude is much higher than the previous limit cycle. This unusually large limit cycle was used, and the results are shown in FIG. 14 for $p = 0.2$, again demonstrating the improvement using constrained truncation (curve 1401) rather than unconstrained truncation (curve 1402).

The results obtained from the aforedescribed studies showed significant improvement in the squelch time of limit cycles. However, the improvement is even more than shown, since the constraints prevent some truncation from occurring. Accordingly, the value of $p$ (probability of truncation) used in the simulation should be increased for the constrained algorithm to ensure a fair comparison that takes into account the quantization errors introduced by truncation in the presence of signals.

It is also to be noted that the adjustable probability factor, $p$, allows a simple tailoring technique for different pole pairs in a system. For pole pairs with relatively few states that round $B_2D_2$ up, a higher value of $p$, (thus more noise) may be used. For pole pairs with exceptionally large amplitude limit cycles, higher values of $p$ may be desirable.

The use of constrained random truncation of the $B_1D_1$ product instead of $B_2D_2$ or of both products is also worthy of mention. Ordinarily, truncating the $B_2D_2$ product is much more effective, since for most limit cycles there are more $B_2D_2$ products that round up than $B_1D_1$ products and, in addition, there is a higher degree of correlation between a limit cycle and the error associated with the $B_2$ multiplier than with the $B_1$ multiplier. However, there are some situations where truncating the $B_1D_1$ products might be more useful, and the extension of the present invention to such cases is straigtforward in the teachings contained herein. If truncation of the $B_1D_1$ product is used, the constraints for allowing truncation, for low frequency poles ($B_1 < 0, B_2 > 0$) are:

$$\text{Sign } D_1 \neq \text{Sign } D_2, \tag{8}$$

or $$|D_1| > |D_2| \tag{9}$$

and for high frequency poles ($B_1 > 0, B_2 > 0$) are:

$$\text{Sign } D_1 = \text{Sign } D_2, \tag{10}$$

or $$|D_1| > |D_2| \tag{11}$$

While the present invention has been described in light of several specific circuit realizations, it is to be understood that other arrangements may also perform adequately and that various changes and adaptations may be made by those skilled in the art. The scope of the invention is thus to be limited only by the appended claims. For example, the circuitry of FIG. 9 is for use with a sign magnitude multiplier of the type shown in FIG. 2 of the Kieburtz et al. patent, which multiplier can be dynamically switched between rounding and truncating modes. However, it is possible to accomplish the effect of constrained truncation of the $B_2D_2$ product by using a normal rounding multiplier in conjunction with a filter configuration which includes the additional adder 1013 of FIG. 10. In this case, ± 1 is randomly added to the circuit output whenever the constraints are met. If the $(-B_2D_2)$ product is positive, a minus 1 is added, and vice-versa. While this approach differs from the one previously described in that ± 1 is added independently of whether or not the $B_2D_2$ product would have rounded up, the overall effectiveness is similar. However, it is to be observed that the value of $p$ can be reduced, since states where $B_2D_2$ rounds down are now effective.

Figure 15:
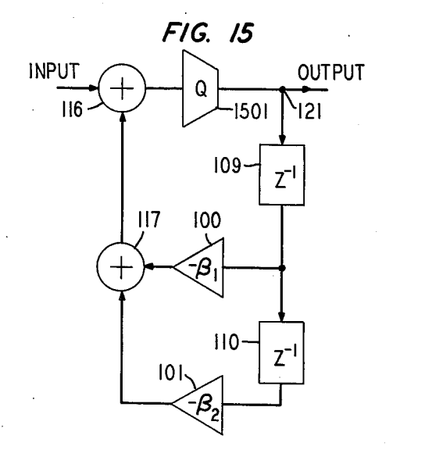
FIG. 15 shows the digital filter of FIG. 1a in a modified form in which a single quantizer is used.

As a second example, the circuitry of FIG. 9 may be readily adapted for use with any other digital multiplier in which control may be exercised over rounding and truncation. If a two's complement multiplier is used, the constraints are somewhat different, however, from those previously described. Specifically, for control over the $B_2D_2$ product, the constraints are:

$$D_1 > D_2 \tag{12}$$

then processed by the remaining components of the filter, including, for example, adders 117 and 116. Alternatively, it is possible to form full precision products, add the products together, and then quantize the sum in a single quantizer. This latter possibility is illustrated in FIG. 15, which duplicates FIG. 1a with the exception that a single quantizer 1501 is inserted between adder 116 and output terminal 121, and, of course, multipliers 100 and 101 do not include quantizers therein.

If the arrangement shown in FIG. 15 is employed, quantization of the sum of products of the feedback loops produces limit cycles in much the same way as the sum of quantized products produces the limit cycles described hereinabove. Again, random switching of the quantization from rounding to truncation, provided constraints are properly implemented, will usually reduce or eliminate these limit cycles. These constraints are, however, slightly modified from the previously described constraints for $B_2D_2$ truncation. In fact, the constraints turn out to be identical to those for $B_1D_1$ truncation, as given in equations (8) through (11).

All of the foregoing constraints are summarized in the following table:

TABLE 4

| | Sign-Magnitude Arithmetic | | | | Two's Complement Arithmetic | | | |
|---|---|---|---|---|---|---|---|---|
| | Constraints for Truncation | | Disallowed Regions of $D_1$-$D_2$ Plot | | Constraints for Truncation | | Disallowed Regions of $D_1$-$D_2$ Plot | |
| Type of Truncation | Low Frequency $B_1 < 0$ | High Frequency $B_1 > O$ | Low Frequency $B_1 < O$ | High Frequency $B_1 > O$ | Low Frequency $B_1 < O$ | High Frequency $B_1 > O$ | Low Frequency $B_1 < O$ | High Frequency $B_1 > O$ |
| $B_2D_2$ | Sign $D_1 \neq$ Sign $D_2$ or $\|D_2\| > \|D_1\|$ | Sign $D_1 =$ Sign $D_2$ or $\|D_2\| > \|D_1\|$ | 0° – 45° and 180° – 225° | 135° – 180° and 315° – 360° | $D_1 > D_2$ | $-D_1 > D_2$ | 45° – 225° | 0° – 135° and 315° – 360° |
| $B_1D_1$ Sum of $B_2D_2$ and $B_1D_1$ | Sign $D_1 \neq$ Sign $D_2$ or $\|D_1\| > \|D_2\|$ | Sign $D_1 =$ Sign $D_2$ or $\|D_1\| > \|D_2\|$ | 45° – 90° and 225° – 270° | 90° – 135° and 270° – 315° | | | | | for the case of low frequency poles ($B_1 < 0$ and $B_2 > O$) and $$-D_1 > D_2 \tag{13}$$

for the case of high frequency poles. These constraints, as before, are derived by a consideration of the $D_1$-$D_2$ plane plots for the limit cycles involved, with the goal of allowing only those transitions in which harmful results (i.e., movement to a larger limit cycle) are not produced. Analysis of these plots shows that for low frequency poles, all arrows point to the left, indicating a disallowed region from 45° to 225°; all arrows point to the right for the case of high frequency poles, with the disallowed region thus being from 0° to 135° and from 315° to 360°.

A still further variation of the above described embodiments involves the quantizers employed in the digital filter network. In all of the filter implementations previously described, the multiplier products were assumed to have been immediately quantized to the original data word length, by quantizers built into or otherwise considered integral parts of multipliers 100 and 101 of FIG. 1a, and their counterparts 100' and 101' of FIG. 1b. These quantized products were With respect to the implementation circuitry of FIG. 9, minor modifications may readily be made to adapt the logic to use with two's complement arithmetic. For low frequency poles, the magnitude constraint circuit 951 correctly identifies the larger of $D_1$ or $D_2$, when these variables have the same sign. If $D_1$ and $D_2$ are of different signs, the answer from circuitry 951 is wrong; however, the sign constraint circuitry 901 can then be adapted such that truncation is allowed if $D_1$ is positive and inhibited if $D_1$ is negative. For high frequency poles, a simple negation transformation is required on $D_1$ before the above described logic can be used, since equations (12) and (13) differ from one another only in the sign of $D_1$.

What is claimed is:

1. In a recursive digital filter including:
    a. a forward path including an input terminal for receiving an input signal $X(n)$ and an output terminal for supplying an output signal $Y(n)$;
    b. a first feedback loop including a first delay element and a first digital multiplier circuit, said first feedback loop being arranged to form a first signal given by the product $-B_1D_1(n)$, wherein $-B_1$ = the multiplier coefficient of said first digital multiplier circuit, $D_1(n) = Y(n-1)$, $n$ = the time at which a variable is sampled, c. a second feedback loop including a second delay element and a second digital multiplier circuit, said first and second feedback loops together being arranged to form a second signal given by the product $-B_2D_2(n)$, wherein $-B_2$ = the multiplier coefficient of said second digital multiplier circuit, and $D_2(n) = Y(n-2) = D_1(n-1)$, d. first means for summing said first and second signals and said input signal to form said output signal, said output signal being given by $Y(n) = X(n) - B_1D_1(n) - B_2D_2(n)$, and e. second means for randomly switching between rounding and truncating of at least one of said products, the improvement comprising:

f. third means operable to control said random switching means, said third means including
  1. fourth means for determining the polarity relationship between $D_1(n)$ and $D_2(n)$ and the polarity of $B_1$,
  2. fifth means for determining the magnitude relationship between $D_1(n)$ and $D_2(n)$, and
  3. sixth means jointly responsive to said fourth and fifth means for selectively inhibiting said second means from truncating said at least one product.

2. The invention defined in claim 1 wherein
a. said second means effects switching of said $-B_2D_2(n)$ product, and
b. said sixth means inhibits truncation if $B_1 > 0$, sign $D_1(n) \neq$ sign $D_2(n)$, and $|D_1(n)| > |D_2(n)|$.

3. The invention defined in claim 1 wherein
a. said second means effects switching of said $-B_2D_2(n)$ product, and
b. said sixth means inhibits truncation if $B_1 < 0$, sign $D_1(n)$ = sign $D_2(n)$, and $|D_1(n)| > |D_2(n)|$.

4. The invention defined in claim 1 wherein
a. said second means effects switching of said $-B_1D_1(n)$ product, and
b. said sixth means inhibits truncation if $B_1 < 0$, sign $D_1(n)$ = sign $D_2(n)$ and $|D_2(n)| > |D_1(n)|$.

5. The invention defined in claim 1 wherein
a. said second means effects switching of said $-B_1D_1(n)$ product, and
b. said sixth means inhibits truncation if $B_1 > 0$, sign $D_1(n) \neq$ sign $D_2(n)$, and $|D_2(n)| > |D_1(n)|$.

6. The invention defined in claim 1 wherein
a. said second means effects switching of the sum of said $-B_1D_1(n)$ and $-B_2D_2(n)$ products, and
b. said sixth means inhibits truncation if $B_1 < 0$, sign $D_1(n)$ = sign $D_2(n)$, and $|D_2(n)| > |D_1(n)|$.

7. The invention defined in claim 1 wherein
a. said second means effects switching of the sum of said $-B_1D_1(n)$ and $-B_2D_2(n)$ products, and
b. said sixth means inhibits truncation if $B_1 > 0$, sign $D_1(n) \neq$ sign $D_2(n)$, and $|D_2(n)| > |D_1(n)|$.

8. The invention defined in claim 1 further including:
a. seventh means for comparing the magnitudes of $D_1(n)$ and $D_2(n)$ for two consecutive values of $n$, and
b. eighth means for reducing the magnitude of $Y(n)$ by one if said consecutive magnitudes of $D_1(n)$ and $D_2(n)$ are the same.

9. The invention defined in claim 8 wherein said eighth means includes an adder circuit disposed in said forward path, and said filter further includes
ninth means arranged to selectively apply the number minus one $(-1)$ to said adder circuit if $Y(n) > 0$ and to apply the number plus one $(+1)$ to said adder circuit if $Y(n) < 0$.

10. In a second order recursive digital filter including
a. an input terminal for receiving an input signal $X(n)$,
b. an output terminal for providing an output signal $Y(n)$,
c. and, at least first and second digital multipliers having multiplier coefficients $-B_1$ and $-B_2$, respectively, said output signal being given by $Y(n) = X(n) - B_1D_1(n) - B_2D_2(n)$ wherein $n$ is the time at which a variable is sampled, $D_1(n)$ is a version of $Y(n)$ removed in time by one sample interval, and $D_2(n)$ is a version of $Y(n)$ removed in time by two sample intervals,
apparatus for eliminating limit cycles in said output signal, comprising:
  1. first means for randomly truncating the output of at least one of said multipliers, and
  2. second means for inhibiting said random truncating means as a function of the relative values of $D_1(n)$ and $D_2(n)$.

11. The invention defined in claim 10 wherein said first and second digital multipliers are arranged to generate products in sign-magnitude format.

12. The invention defined in claim 11 wherein truncation of said output of said second digital multiplier is controlled by said first means.

13. The invention defined in claim 12 wherein said second means is arranged to inhibit truncation if $|D_1(n)| > |D_2(n)|$.

14. The invention defined in claim 12 further including third means for inhibiting said random truncation as a function of the polarities of $D_1(n)$, $D_2(n)$ and $B_1$.

15. The invention defined in claim 14 wherein said third means is arranged to inhibit truncation if sign $(B_1D_1(n)) \neq$ sign $(B_2D_2(n))$.

16. The invention defined in claim 11 wherein truncation of said output of said first digital multiplier is controlled by said first means.

17. The invention defined in claim 14 wherein said second means is arranged to inhibit truncation if $|D_2(n)| > |D_1(n)|$.

18. The invention defined in claim 16 further including third means for inhibiting said random truncation as a function of the polarities of $D_1(n)$, $D_2(n)$ and $B_1$.

19. The invention defined in claim 18 wherein said third means is arranged to inhibit truncation if sign $(B_1D_1(n)) \neq$ sign $(B_2D_2(n))$.

20. The invention defined in claim 10 wherein said first and second digital multipliers are arranged to generate products in two's-complement format.

21. The invention defined in claim 20 wherein said second means is arranged to inhibit truncation if $B_1 < 0$, and $D_1(n) < D_2(n)$.

22. The invention defined in claim 20 wherein said second means is arranged to inhibit truncation if $B_1 > 0$, and $-D_1(n) < D_2(n)$.

23. The invention defined in claim 10 further including:

third means for generating a control signal upon the occurrence of three consecutive equal values of $D_1(n)$; and fourth means responsive to said control signal for reducing the magnitude of $Y(n)$ by one.

24. In a recursive digital filter including
a. first means arranged to generate a first digital product $-B_1D_1(n)$ by multiplying a delayed version $D_1(n)$ of the output $Y(n)$ of said filter by a multiplier coefficient $-B_1$, said first product being represented by a variable number of digital bits,
b. second means arranged to generate a second digital product $-B_2D_2(n)$ by multiplying a delayed version $D_2(n)$ of said $D_1(n)$ version by a multiplier coefficient $-B_2$, said second product being represented by a variable number of digital bits,
c. third means for summing said first and second digital products and an input signal $X(n)$ to said filter to form said filter output $Y(n)$,
d. fourth means for quantizing said first and second products to a desired bit length by retaining only the most significant portions of said products and discarding the least significant portions of said products,
e. fifth means for generating a control signal,
f. sixth means for rounding the least significant bits of said most significant portions in accordance with the most significant bits of said least significant portions, in the presence of said control signal and truncating said least significant bits of said most significant portions in the absence of said control signal, and
g. seventh means for randomly inhibiting said control signal, the improvement comprising
circuitry for insuring that $Y(n)$ rapidly approaches zero when $X(n) = 0$, $D_1(n) \neq 0$ and $D_2(n) \neq 0$, said circuitry comprising h. eighth means for generating a second control signal as a function of the values of $D_1(n)$ and $D_2(n)$, and
i. ninth means for disabling said seventh means in response to said second control signal.

25. The invention defined in claim 24 wherein said eighth means is arranged to generate said second control signal if sign $(B_1D_1(n))$ = sign $(B_2D_2(n))$ or $|D_1(n)| > |D_2(n)|$.

26. The invention defined in claim 24 further including tenth means for reducing the value of $Y(n)$ by one if $D_1(n) = D_2(n) = Y(n)$.

27. In a second order recursive digital filter including
a. an input terminal for receiving an input signal $X(n)$,
b. an output terminal for providing an output signal $Y(n)$,
c. and at least first and second digital multipliers having multiplier coefficients $-_1$ and $-B_2$, respectively, said output signal being given by
$$Y(n) = X(n) - B_1D_1(n) - B_2D_2(n)$$

wherein $n$ is the time at which a variable is sampled, $D_1(n)$ is a version of $Y(n)$ removed in time by one sample interval, and $D_2(n)$ is a version of $Y(n)$ removed in time by two sample intervals,
apparatus for eliminating limit cycles in said output signal, comprising:
1. first means in said first and second multipliers for rounding the outputs thereof,
2. second means for changing the magnitude of $Y(n)$ by one, as a function of the relative magnitude of $D_1(n)$ and $D_2(n)$, and
3. third means for randomly operating said second means.

28. The invention defined in claim 27 wherein said second means is arranged to reduce the magnitude of $Y(n)$ by one if $|D_1(n)| > |D_2(n)|$.

29. The invention defined in claim 27 wherein said second means is arranged to increase the magnitude of $Y(n)$ by one if $|D_2(n)| > |D_1(n)|$.

* * * * *